United States Patent
Tanaka

(10) Patent No.: US 10,121,908 B2
(45) Date of Patent: Nov. 6, 2018

(54) HIGH WITHSTAND VOLTAGE DIODE AND POWER CONVERSION DEVICE

(71) Applicant: Mitsubishi Electric Corporation, Tokyo (JP)

(72) Inventor: Koji Tanaka, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/840,753

(22) Filed: Dec. 13, 2017

(65) Prior Publication Data
US 2018/0261700 A1   Sep. 13, 2018

(30) Foreign Application Priority Data

Mar. 13, 2017   (JP) .................. 2017-046956

(51) Int. Cl.
| | |
|---|---|
| H01L 29/02 | (2006.01) |
| H01L 29/861 | (2006.01) |
| H01L 29/08 | (2006.01) |
| H01L 29/06 | (2006.01) |
| H02P 27/06 | (2006.01) |
| H01L 29/20 | (2006.01) |
| H01L 29/739 | (2006.01) |
| H01L 27/06 | (2006.01) |
| H01L 29/16 | (2006.01) |

(52) U.S. Cl.
CPC ...... *H01L 29/8611* (2013.01); *H01L 29/0684* (2013.01); *H01L 29/08* (2013.01); *H02P 27/06* (2013.01); *H01L 27/0635* (2013.01); *H01L 29/1608* (2013.01); *H01L 29/2003* (2013.01); *H01L 29/7395* (2013.01)

(58) Field of Classification Search
CPC .............. H01L 29/872; H01L 29/1608; H01L 29/66143; H01L 29/02529; H01L 27/0814; H01L 29/41716; H01L 21/322; H01L 29/32; H01L 29/66128; H01L 29/167
USPC .......... 257/77, 487, 496, 502, 504; 438/570
See application file for complete search history.

(56) References Cited

U.S. PATENT DOCUMENTS

2015/0144965 A1* 5/2015 Tsuji .................. H01L 29/47
                                                      257/77
2017/0317075 A1* 11/2017 Arai .................. H01L 27/0814

FOREIGN PATENT DOCUMENTS

| JP | 2007-158320 A | 6/2007 |
| JP | 2016-195271 A | 11/2016 |

* cited by examiner

*Primary Examiner* — Thinh T Nguyen
(74) *Attorney, Agent, or Firm* — Studebaker & Brackett PC

(57) ABSTRACT

It is an object of the present invention to provide a semiconductor device capable of adjusting a $V_F$-$E_{REC}$ trade-off characteristic without a life-time control and a power conversion device having the semiconductor device. A semiconductor device according to the present invention includes a p⁻-type anode layer including a donor impurity and an acceptor impurity. An acceptor impurity concentration of the p-type anode layer is equal to or larger than a donor impurity concentration of the p⁻-type anode layer, an acceptor impurity concentration of the p⁻-type anode layer is equal to or larger than a donor impurity concentration of the p⁻-type anode layer, and a donor impurity concentration of the p⁻-type anode layer is equal to or larger than a donor impurity concentration of the n-type drift layer.

8 Claims, 3 Drawing Sheets

HIGH WITHSTAND VOLTAGE DIODE AND POWER CONVERSION DEVICE

BACKGROUND OF THE INVENTION

Field of the Invention

The present invention relates to a semiconductor device such as a diode used in a power module having a high withstand voltage of 600 V or higher and a power conversion device having the semiconductor device.

Description of the Background Art

Conventionally proposed is a diode in which an n-type buffer layer is provided between an n⁻-type drift layer and an n-type cathode layer (Japanese Patent Application Laid-Open No. 2007-158320, for example).

SUMMARY

Problem to be Solved by the Invention

In the conventional diode, a trade-off characteristic of an on-voltage $V_F$ and a recovery loss $E_{REC}$ of the diode is traditionally adjusted by a life-time control using a heavy metal diffusion or a technique of irradiation of electrons or ions. The trade-off characteristic of the on-voltage $V_F$ and the recovery loss $E_{REC}$ is referred to as a $V_F$-$E_{REC}$ trade-off characteristic hereinafter.

However, there arises a problem in the case of adjusting the $V_F$-$E_{REC}$ trade-off characteristic by the life-time control that a variation increases in the on-voltage $V_F$ and the recovery loss $E_{REC}$ depending on an irradiation angle with an irradiated body or a temperature at the time of the irradiation of the electrons or ions, for example. Moreover, there arises a problem that a lattice defect changes due to a self-generated heat in a chip energizing operation, and an electrical characteristic therefore fluctuates. Furthermore, there also arises a problem that a defect occurs in a high-temperature operation due to a large leak current caused by the lattice defect. Accordingly, anticipated is an adjustment of the $V_F$-$E_{REC}$ trade-off characteristic without the life-time control.

The present invention is made to solve the above problems, and it is an object of the present invention to provide a semiconductor device capable of adjusting a $V_F$-$E_{REC}$ trade-off characteristic without a life-time control and a power conversion device having the semiconductor device.

Means to Solve the Problem

A semiconductor device includes an n-type drift layer, a first p-type anode layer provided on a surface of the n-type drift layer, at least one second p-type anode layer being selectively provided on a surface of the first p-type anode layer, including a donor impurity and an acceptor impurity, and having an acceptor impurity concentration lower than the first p-type anode layer, an n-type buffer layer provided on a rear surface of the n-type drift layer, and an n-type cathode layer and a p-type cathode layer provided to be adjacent to each other in a planar view on a surface of the n-type buffer layer, wherein a thickness of the n-type cathode layer is equal to or larger than a thickness of the p-type cathode layer, a thickness of the first p-type anode layer is equal to or larger than a thickness of the second p-type anode layer, a donor impurity concentration of the n-type cathode layer is equal to or larger than an acceptor impurity concentration of the p-type cathode layer, an acceptor impurity concentration of the first p-type anode layer is equal to or larger than a donor impurity concentration of the second p-type anode layer, an acceptor impurity concentration of the second p-type anode layer is equal to or larger than a donor impurity concentration of the second p-type anode layer, and a donor impurity concentration of the second p-type anode layer is equal to or larger than a donor impurity concentration of the n-type drift layer.

Effects of the Invention

According to the present invention, a semiconductor device includes an n-type drift layer, a first p-type anode layer provided on a surface of the n-type drift layer, at least one second p-type anode layer being selectively provided on a surface of the first p-type anode layer, including a donor impurity and an acceptor impurity, and having an acceptor impurity concentration lower than the first p-type anode layer, an n-type buffer layer provided on a rear surface of the n-type drift layer, and an n-type cathode layer and a p-type cathode layer provided to be adjacent to each other in a planar view on a surface of the n-type buffer layer, wherein a thickness of the n-type cathode layer is equal to or larger than a thickness of the p-type cathode layer, a thickness of the first p-type anode layer is equal to or larger than a thickness of the second p-type anode layer, a donor impurity concentration of the n-type cathode layer is equal to or larger than an acceptor impurity concentration of the p-type cathode layer, an acceptor impurity concentration of the first p-type anode layer is equal to or larger than a donor impurity concentration of the second p-type anode layer, an acceptor impurity concentration of the second p-type anode layer is equal to or larger than a donor impurity concentration of the second p-type anode layer, and a donor impurity concentration of the second p-type anode layer is equal to or larger than a donor impurity concentration of the n-type drift layer, thus the $V_F$-$E_{REC}$ trade-off characteristic can be adjusted without a life-time control.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are described hereinafter based on the drawings.

<Premise Technique>

Figure 6:
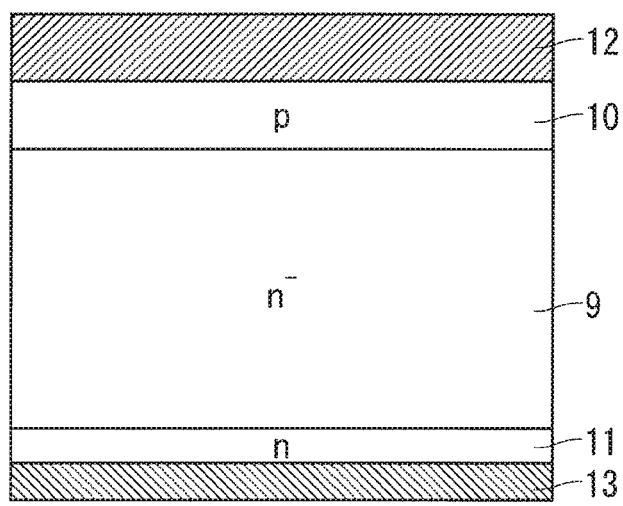
FIG. 6 is a diagram illustrating a configuration of a semiconductor device according to a premise technique.

Firstly, a technique as a premise of the present invention is described. FIG. 6 is a diagram illustrating a configuration of a semiconductor device according to the premise technique.

A p-type anode layer 10 is provided on a surface of an n⁻-type drift layer 9. The p-type anode layer 10 is formed by diffusing an acceptor impurity from the surface of the n⁻-type drift layer 9.

An n-type cathode layer 11 is provided on a rear surface of the n⁻-type drift layer 9. The n-type cathode layer 11 is formed by diffusing a donor impurity from the rear surface of the n⁻-type drift layer 9.

The anode electrode 12 is provided to have an ohmic contact with the p-type anode layer 10. The cathode electrode 13 is provided to have an ohmic contact with the n-type cathode layer 11.

The $V_F$-$E_{REC}$ trade-off characteristic needs to be adjusted by the life-time control in the semiconductor device according to the premise technique, and this case has the above problem. The present invention is made to solve the above problems, and is described in detail hereinafter.

Embodiment 1

<Configuration>

Figure 1:
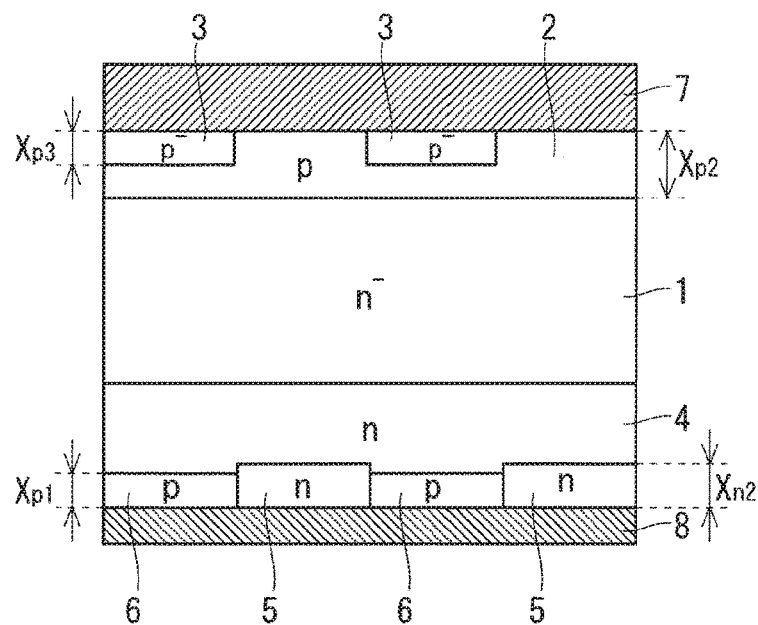
FIG. 1 is a diagram illustrating an example of a configuration of a semiconductor device according to an embodiment 1 of the present invention.

FIG. 1 is a diagram illustrating an example of a configuration of a semiconductor device according to the embodiment 1 of the present invention.

A p-type anode layer 2 which is a first p-type anode layer is provided on a surface of an n⁻-type drift layer 1 which is an n-type drift layer. The p-type anode layer 2 is formed by diffusing an acceptor impurity from the surface of the n⁻-type drift layer 1. Specifically, the p-type anode layer 2 is formed by diffusing an acceptor impurity having an acceptor impurity concentration $C_{p1}$ in a region of a diffusion depth $X_{p2}$ from the surface of the n⁻-type drift layer 1. For example, the diffusion depth $X_{p2}$ is 1.5~8 [μm], and the acceptor impurity concentration $C_{p1}$ is 1E15~1E17 [atom/cm³]. The diffusion depth $X_{p2}$ corresponds to a thickness of the p-type anode layer 2. The n⁻-type drift layer 1 includes the donor impurity having a donor impurity concentration $C_n$.

A plurality of p⁻-type anode layers 3 which are second p-type anode layers are selectively provided on a surface of the p-type anode layer 2. The p⁻-type anode layer 3 is formed by diffusing a donor impurity and an acceptor impurity from the surface of the n⁻-type drift layer 1. That is to say, the p⁻-type anode layer 3 includes the donor impurity and the acceptor impurity. The acceptor impurity concentration of the p⁻-type anode layer 3 is lower than that of the p-type anode layer 2. Specifically, the p⁻-type anode layer 3 is formed by diffusing a donor impurity having a donor impurity concentration $C_{n3}$ and an acceptor impurity having an acceptor impurity concentration $C_{p3}$ in a region of a diffusion depth $X_{p3}$ from the surface of the n⁻-type drift layer 1. For example, the diffusion depth $X_{p3}$ is 60~95 [%] of the diffusion depth $X_{p2}$ of the p-type anode layer 2, the donor impurity concentration $C_{n3}$ is 60~95 [%] of the acceptor impurity concentration $C_{p1}$ of the p-type anode layer 2, and the acceptor impurity concentration $C_{p3}$ is 1E15~1E17 [atom/cm³]. The diffusion depth $X_{p3}$ corresponds to a thickness of the p⁻-type anode layer 3.

An n-type buffer layer 4 is provided on a rear surface of the n⁻-type drift layer 1. The n-type buffer layer 4 is formed by diffusing a donor impurity from the rear surface of the n⁻-type drift layer 1.

A plurality of n-type cathode layers 5 and p-type cathode layers 6 are adjacent to each other and alternately provided in a planar view on a surface of the n-type buffer layer 4. The n-type cathode layer 5 is formed by diffusing a donor impurity from the rear surface of the n⁻-type drift layer 1. Specifically, the n-type cathode layer 5 is formed by diffusing a donor impurity having a donor impurity concentration $C_{n2}$ in a region of a diffusion depth $X_{n2}$ from the rear surface of the n⁻-type drift layer 1. The diffusion depth $X_{n2}$ corresponds to a thickness of the n-type cathode layer 5.

The p-type cathode layer 6 is formed by diffusing an acceptor impurity from the rear surface of the n⁻-type drift layer 1. Specifically, the p-type cathode layer 6 is formed by diffusing an acceptor impurity having an acceptor impurity concentration $C_{p1}$ in a region of a diffusion depth $X_{p1}$ from the rear surface of the n⁻-type drift layer 1. The diffusion depth $X_{p1}$ corresponds to a thickness of the p-type cathode layer 6.

An anode electrode 7 is provided to have an ohmic contact with the p-type anode layer 2. A cathode electrode 8 is provided to have an ohmic contact with the n-type cathode layer 5. The n-type cathode layer 5 and the p-type cathode layer 6 are short-circuited via the cathode electrode 8.

In the semiconductor device illustrated in FIG. 1, the diffusion depth $X_{n2}$ of the n-type cathode layer 5 is equal to or larger than the diffusion depth $X_{p1}$ of the p-type cathode layer 6. That is to say, a relationship of the diffusion depth $X_{n2}$≥the diffusion depth $X_{p1}$ is satisfied.

The diffusion depth $X_{p2}$ of the p-type anode layer 2 is equal to or larger than the diffusion depth $X_{p3}$ of the p⁻-type anode layer 3. That is to say, a relationship of the diffusion depth $X_{p2}$ the diffusion depth $X_{p3}$ is satisfied.

The donor impurity concentration $C_{n2}$ of the n-type cathode layer 5 is equal to or larger than the acceptor impurity concentration $C_{p1}$ of the p-type cathode layer 6. That is to say, a relationship of the donor impurity concentration $C_{n2}$≥the acceptor impurity concentration $C_{p1}$ is satisfied.

The acceptor impurity concentration $C_{p2}$ of the p-type anode layer 2 is equal to or larger than the donor impurity concentration $C_{n3}$ of the p⁻-type anode layer 3. That is to say, a relationship of the acceptor impurity concentration $C_{p2}$≥the donor impurity concentration $C_{n3}$ is satisfied.

The acceptor impurity concentration $C_{p3}$ of the p⁻-type anode layer 3 is equal to or larger than the donor impurity concentration $C_{n3}$ of the p⁻-type anode layer 3. That is to say, a relationship of the acceptor impurity concentration $C_{p3}$≥the donor impurity concentration $C_{n3}$ is satisfied.

The donor impurity concentration $C_{n3}$ of the p⁻-type anode layer 3 is equal to or larger than the donor impurity concentration $C_{n3}$ of the n⁻-type drift layer 1. That is to say, a relationship of the donor impurity concentration $C_{n3}$≥the donor impurity concentration $C_n$ is satisfied.

<Function Effect>

Firstly, a relationship between a rear surface p/n pitch and the $V_F$-$E_{REC}$ trade-off characteristic is described.

When the rear surface p/n pitch which indicates a width of combining the width of one n-type cathode layer 5 and the width of one p-type cathode layer 6 is reduced, an on voltage $V_F$ increases and a recovery loss $E_{REC}$ decreases. That is to say, a $V_F$-$E_{REC}$ trade-off curve indicating the $V_F$-$E_{REC}$ trade-off characteristic is shifted to a high speed side.

Accordingly, it is desirable to adjust the $V_F$-$E_{REC}$ trade-off characteristic by changing the rear surface p/n pitch in a freewheel diode incorporated into an inverter for various purposes. However, when the rear surface p/n pitch is designed to be too small, a snap-off withstand voltage decreases, and when the rear surface p/n pitch is designed to be too large, a recovery resistance decreases. The configuration illustrated in FIG. 1 can prevent the trade-off described above, thus the $V_F$-$E_{REC}$ trade-off characteristic can be adjusted in a wide range.

Next, a relationship between a rear surface p/n short-circuit rate and the $V_F$-$E_{REC}$ trade-off characteristic is described.

When the rear surface p/n short-circuit rate which is an occupancy of p in the rear surface p/n pitch is reduced, the on voltage $V_F$ increases and the recovery loss $E_{REC}$ decreases. That is to say, the $V_F$-$E_{REC}$ trade-off curve is shifted to the high speed side. Accordingly, it is desirable to adjust the $V_F$-$E_{REC}$ trade-off characteristic by changing the rear surface p/n short-circuit rate in the freewheel diode incorporated into the inverter for various purposes. However, when the rear surface p/n short-circuit rate is designed to be too small, the snap-off withstand voltage decreases and a cross point increases, and when the rear surface p/n short-circuit rate is designed to be too large, a recovery resistance decreases. As illustrated in FIG. 1, an implantation efficiency from an anode side can be controlled by providing the p$^-$-type anode layer 3, thus the trade-off described above can be prevented. Accordingly, the $V_F$-$E_{REC}$ trade-off characteristic can be adjusted without the life-time control.

Next, a relationship between the p-type anode layer and the $V_F$-$E_{REC}$ trade-off characteristic is described.

When the acceptor impurity concentration of the p-type anode layer is reduced, the on voltage $V_F$ increases and the recovery loss $E_{REC}$ decreases. That is to say, the $V_F$-$E_{REC}$ trade-off curve is shifted to the high speed side. As a secondary effect, when a carrier concentration on the anode side in an ON state decreases, a reverse current $I_{rr}$ in recovery also decreases, and a carrier concentration on the cathode side relatively increases, thus the snap-off resistance can be enhanced. However, when the acceptor impurity concentration of the p-type anode layer is reduced too much, the withstand voltage decreases. As illustrated in FIG. 1, the implantation efficiency from the anode side can be controlled by providing the p$^-$-type anode layer 3, thus the trade-off described above can be prevented. Accordingly, the $V_F$-$E_{REC}$ trade-off characteristic can be adjusted without the life-time control.

Next, a maximum breaking current density in the recovery is described.

The maximum breaking current density in the recovery decreases in a diode which has a bipolar transistor structure parasitic in a vertical direction compared with the diode which does not have the bipolar transistor structure parasitic in the vertical direction. Herein, the diode having the bipolar transistor structure parasitic in the vertical direction indicates a diode having a PNP structure or an NPN structure in the vertical direction. The vertical direction corresponds to a thickness direction of each layer. As illustrated in FIG. 1, an operation of the bipolar transistor parasitic in the vertical direction can be suppressed by providing the p$^-$-type anode layer 3, thus the reduction in the maximum breaking current density in the recovery can be suppressed.

In the configuration illustrated in FIG. 1, the p$^-$-type anode layer 3 is provided in a position facing the p-type cathode layer 6. At this time, a width of the p$^-$-type anode layer 3 may be the same as the width of the p-type cathode layer 6. The width of the p$^-$-type anode layer 3 may be smaller than the width of the p-type cathode layer 6. The plurality of p$^-$-type anode layers 3 may be dispersedly provided. Any configuration can obtain the effect described above.

Although the diode is described above as an example, there is no limitation on a withstand voltage class or a semiconductor material. That is to say, also when the configuration illustrated in FIG. 1 is applied to a semiconductor device using a wide band gap semiconductor material such as SiC or GaN as well as Si, the effect similar to the effect described above can be obtained. Moreover, also when the configuration illustrated in FIG. 1 is applied to a diode region in a reverse conducting insulated gate bipolar transistor (RC-IGBT), for example, the effect similar to the effect described above can be obtained.

Embodiment 2

<Configuration>

Figure 2:
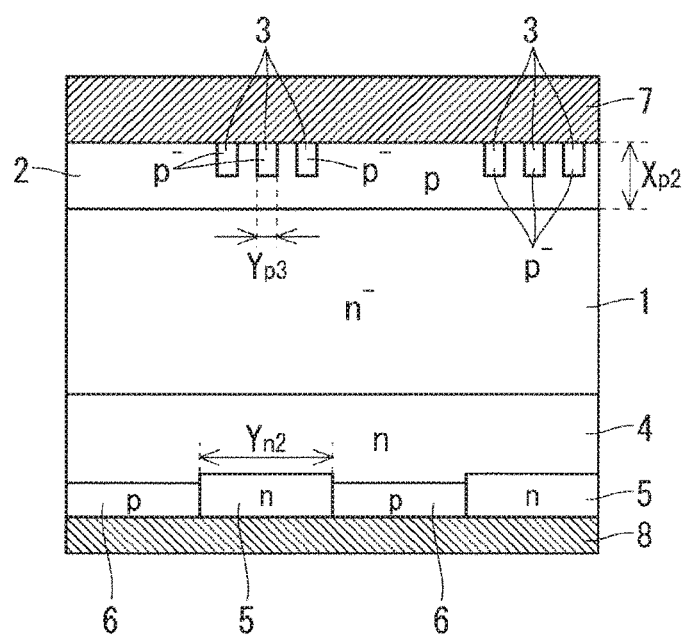
FIG. 2 is a diagram illustrating an example of a configuration of a semiconductor device according to an embodiment 2 of the present invention.

FIG. 2 is a diagram illustrating an example of a configuration of a semiconductor device according to the embodiment 2 of the present invention.

As illustrated in FIG. 2, each of the plurality of p$^-$-type anode layers 3 is dispersedly provided in a position facing each of the n-type cathode layers 5. A width $Y_{p3}$ of the p$^-$-type anode layer 3 is smaller than a width $Y_{n2}$ of the n-type cathode layer 5. Since the other configuration of the embodiment 2 is similar to that of the embodiment 1, the detailed description is omitted herein.

Accordingly to the embodiment 2, the $V_F$-$E_{REC}$ trade-off characteristic can be adjusted without the life-time control in a manner similar to the embodiment 1. Moreover, the $V_F$-$E_{REC}$ trade-off curve can be shifted to the high speed side compared with the case, according to the embodiment 1, of providing the p$^-$-type anode layer 3 in the position facing the p-type cathode layer 6 as illustrated in FIG. 1.

Although the example in FIG. 2 illustrates the configuration of dispersedly providing the plurality of p$^-$-type anode layers 3 in the position facing the n-type cathode layer 5, the configuration is not limited thereto. For example, the p$^-$-type anode layer 3 having the same width with that of the n-type cathode layer 5 may be provided in the position facing the n-type cathode layer 5. The p$^-$-type anode layers 3 having a width smaller than the n-type cathode layer 5 may be provided in the position facing the n-type cathode layer 5. Any configuration can obtain the effect described above.

Embodiment 3

Figure 3:
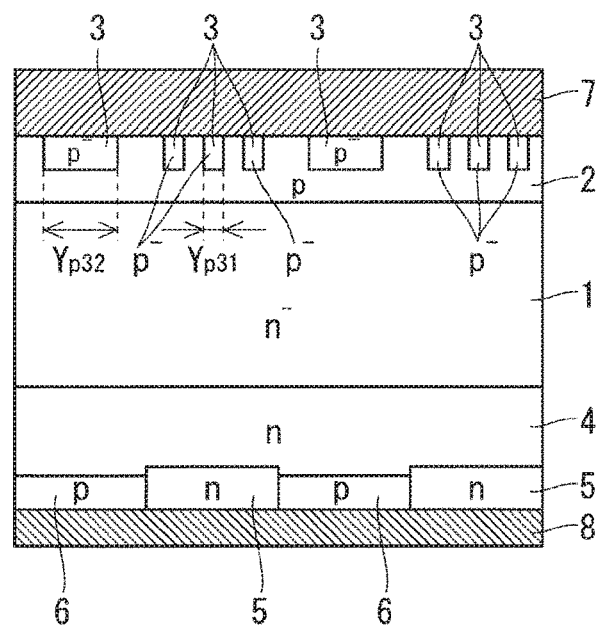
FIG. 3 is a diagram illustrating an example of a configuration of a semiconductor device according to an embodiment 3 of the present invention.

FIG. 3 is a diagram illustrating an example of a configuration of a semiconductor device according to the embodiment 3 of the present invention.

As illustrated in FIG. 3, each of the p$^-$-type anode layers 3 is provided in a position facing each of the n-type cathode layers 5 and the p-type cathode layers 6. Each of the plurality of p$^-$-type anode layers 3 provided in the position facing each of the n-type cathode layers 5 are dispersedly provided. A width $Y_{p31}$ of the p$^-$-type anode layer 3 provided in the position facing the n-type cathode layer 5 is smaller than a width $Y_{p32}$ of the p$^-$-type anode layer 3 provided in the position facing the p-type cathode layer 6. Since the other configuration of the embodiment 3 is similar to that of the embodiment 1, the detailed description is omitted herein.

The embodiment 3 can obtain the effect obtained by combining the embodiment 1 and the embodiment 2. That is to say, the $V_F$-$E_{REC}$ trade-off characteristic can be adjusted without the life-time control. Moreover, the reduction in the maximum breaking current density in the recovery can be suppressed.

Although the example in FIG. 3 illustrates the configuration of dispersedly providing the plurality of p⁻-type anode layers 3 in the position facing the n-type cathode layer 5, and providing the p⁻-type anode layer 3 having the width smaller than the p-type cathode layer 6 in the position facing the p-type cathode layer 6, the configuration is not limited thereto. For example, the p⁻-type anode layer 3 having the same width with that of the n-type cathode layer 5 may be provided in the position facing the n-type cathode layer 5. The p⁻-type anode layers 3 having the width smaller than the n-type cathode layer 5 may be provided in the position facing the n-type cathode layer 5. The p⁻-type anode layer 3 having the same width with that of the p-type cathode layer 6 may be provided in the position facing the p-type cathode layer 6. Each of the plurality of p⁻-type anode layers 3 may be dispersedly provided in the position facing each of the p-type cathode layers 6. Any configuration can obtain the effect described above.

Embodiment 4

Figure 4:
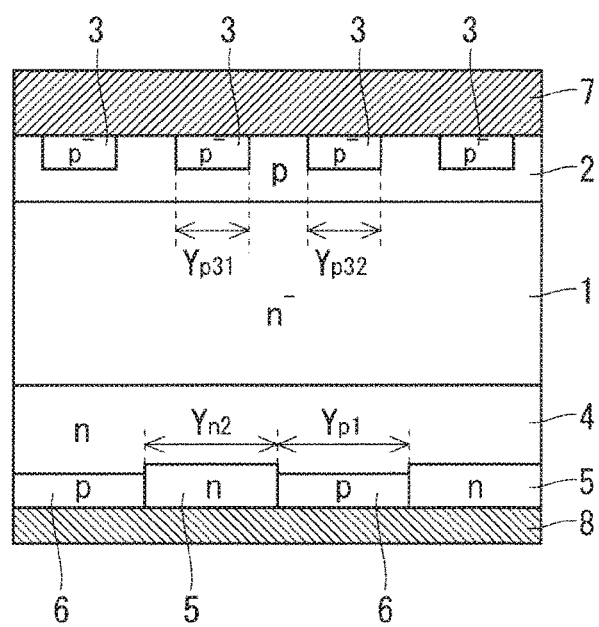
FIG. 4 is a diagram illustrating an example of a configuration of a semiconductor device according to an embodiment 4 of the present invention.

FIG. 4 is a diagram illustrating an example of a configuration of a semiconductor device according to the embodiment 4 of the present invention. As illustrated in FIG. 4, each of the p⁻-type anode layers 3 is provided in a position facing each of the n-type cathode layers 5 and the p-type cathode layers 6. The width $Y_{p31}$ of the p⁻-type anode layer 3 provided in the position facing the n-type cathode layer 5 is smaller than the width $Y_{n2}$ of the n-type cathode layer 5. The width $Y_{p32}$ of the p⁻-type anode layer 3 provided in the position facing the p-type cathode layer 6 is smaller than the width $Y_{p1}$ of the p-type cathode layer 6.

The embodiment 4 can obtain the effect obtained by combining the embodiment 1 and the embodiment 2. That is to say, the $V_F$-$E_{REC}$ trade-off characteristic can be adjusted without the life-time control. Moreover, the reduction in the maximum breaking current density in the recovery can be suppressed.

Although the example in FIG. 4 illustrates the configuration of providing the p⁻-type anode layers 3 having the width smaller than the n-type cathode layer 5 in the position facing the n-type cathode layer 5, and providing the p⁻-type anode layer 3 having the width smaller than the p-type cathode layer 6 in the position facing the p-type cathode layer 6, the configuration is not limited thereto. For example, the p⁻-type anode layers 3 having the same width with that of the n-type cathode layer 5 may be provided in the position facing the n-type cathode layer 5. Each of the plurality of p⁻-type anode layers 3 may be dispersedly provided in the position facing each of the n-type cathode layers 5. The p⁻-type anode layer 3 having the same width with that of the p-type cathode layer 6 may be provided in the position facing the p-type cathode layer 6. Each of the plurality of p⁻-type anode layers 3 may be dispersedly provided in the position facing each of the p-type cathode layers 6. Any configuration can obtain the effect described above.

Embodiment 5

The semiconductor device according to the aforementioned embodiments 1 to 4 is applied to a power conversion device in the embodiment 5 of the present invention. Although the present invention is not limited to a specific power conversion device, described hereinafter as the embodiment 5 is a case of applying the present invention to a three-phase inverter.

Figure 5:
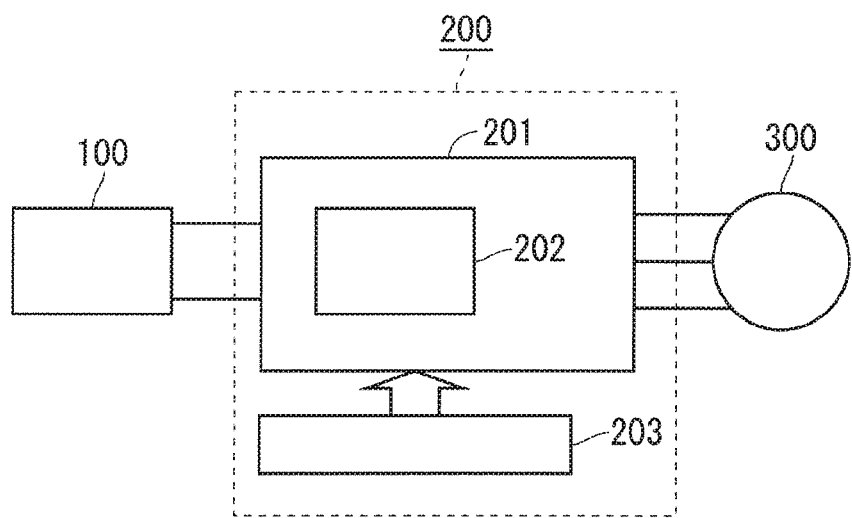
FIG. 5 is a block diagram illustrating a configuration of a power conversion system applying a power conversion device according to an embodiment 5 of the present invention.

FIG. 5 is a block diagram illustrating a configuration of a power conversion system applying the power conversion device according to the embodiment 5.

The power conversion system illustrated in FIG. 5 is made up of a power source 100, a power conversion device 200, and a load 300. The power source 100, which is a direct current power source, supplies a direct current power to the power conversion device 200. The power source 100 can be made up of various types of components such as a direct current system, a solar battery, or a rechargeable battery, or may be also made up of a rectifying circuit connected to an alternating current system or an AC/DC converter. The power source 100 may be also made up of a DC/DC converter which converts a direct current power being output from the direct current system into a predetermined power.

The power conversion device 200, which is a three-phase inverter connected between the power source 100 and the load 300, converts the direct current power supplied from the power source 100 into the alternating current power to supply the alternating current power to the load 300. As illustrated in FIG. 5, the power conversion device 200 includes a main conversion circuit 201 which converts the direct current power into the alternating current power and a control circuit 203 which outputs control signals for controlling the main conversion circuit 201 to the main conversion circuit 201.

The load 300 is a three-phase electrical motor driven by the alternating current power supplied from the power conversion device 200. The load 300 is not for specific purpose of use but is the electrical motor mounted on various types of electrical devices, thus it is used as the electrical motor for a hybrid car, an electrical car, a rail vehicle, an elevator, or an air-conditioning equipment, for example.

The power conversion device 200 is described in detail hereinafter. The main conversion circuit 201 includes a switching element and a reflux diode (not shown), and when a switching is performed on the switching element, the direct current power supplied from the power source 100 is converted into the alternating current power and then supplied to the load 300. The main conversion circuit 201 includes various types of specific circuit configurations, and the main conversion circuit 201 according to the present embodiment is a three-phase full-bridge circuit having two levels, and can be made up of six switching elements and six reflux diodes being antiparallel to each switching element. The semiconductor device according to any one of the aforementioned embodiments 1 to 4 is applied to each reflux diode in the main conversion circuit 201. The two switching elements among the six switching elements are series-connected to each other to constitute upper and lower arms, and each of the upper and lower arms constitutes each phase (U-phase, V-phase, and W-phase) of the full-bridge circuit. An output terminal of each of the upper and lower arms, that is to say, three output terminals of the main conversion circuit 201 are connected to the load 300.

The main conversion circuit 201 includes a drive circuit (not shown) for driving each switching element. The drive circuit may be embedded in a semiconductor module 202 or may also be provided separately from the semiconductor module 202. The drive circuit generates drive signals for driving the switching element of the main conversion circuit 201, and supplies the drive signals to a control electrode of the switching element of the main conversion circuit 201.

Specifically, the drive circuit outputs the drive signals for switching the switching element to an ON state and the drive signals for switching the switching element to an OFF state to the control electrode of each switching element in accordance with the control signals from the control circuit 203 described hereinafter. The drive signals are voltage signals (ON signals) equal to or higher than a threshold voltage of the switching element when the switching element is kept in the ON state, and the drive signals are voltage signals (OFF signals) equal to or lower than the threshold voltage of the switching element when the switching element is kept in the OFF state.

The control circuit 203 controls the switching element of the main conversion circuit 201 to supply a desired power to the load 300. Specifically, the control circuit 203 calculates a time when each switching element of the main conversion circuit 201 needs to enter the ON state, based on the power which needs to be supplied to the load 300. For example, the main conversion circuit 201 can be controlled by performing PWN control for modulating an ON time of the switching element in accordance with the voltage which needs to be output. Then, the control circuit 203 outputs a control instruction (control signals) to the drive circuit included in the main conversion circuit 201 so that the drive circuit outputs the ON signals to the switching element which needs to enter the ON state and outputs the OFF signals to the switching element which needs to enter the OFF state at each time. The drive circuit outputs the ON signals or the OFF signals as the drive signals to the control electrode of each switching element in accordance with the control signals.

Since the semiconductor module according to the embodiments 1 to 4 is applied as the reflux diode of the main conversion circuit 201 in the power conversion device according to the present embodiment, the electrical characteristic can be enhanced.

Although the example of applying the present invention to the three-phase inverter having the two levels is described in the present embodiment, the present invention is not limited thereto, but can be applied to the various power conversion devices. Although the power conversion device having the two levels is described in the present embodiment, a power conversion device having three or multiple levels may also applied. The present invention may be applied to a single-phase inverter when the power is supplied to a single-phase load. The present invention can be also applied to a DC/DC converter or an AC/DC converter when the power is supplied to the direct current load, for example.

The load of the power conversion device applying the present invention is not limited to the electrical motor as described above, thus the power conversion device applying the present invention can also be used as a power-supply device of an electrical discharge machine, a laser beam machine, an induction heat cooking device, or a non-contact power feeding system, and can also be further used as a power conditioner of a solar power system or an electricity storage system, for example.

According to the present invention, the above embodiments can be arbitrarily combined, or each embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
an n-type drift layer;
a first p-type anode layer provided on a surface of said n-type drift layer;
at least one second p-type anode layer being selectively provided on a surface of said first p-type anode layer, including a donor impurity and an acceptor impurity, and having an acceptor impurity concentration lower than said first p-type anode layer;
an n-type buffer layer provided on a rear surface of said n-type drift layer; and
an n-type cathode layer and a p-type cathode layer provided to be adjacent to each other in a planar view on a surface of said n-type buffer layer, wherein
a thickness of said n-type cathode layer is equal to or larger than a thickness of said p-type cathode layer,
a thickness of said first p-type anode layer is equal to or larger than a thickness of said second p-type anode layer,
a donor impurity concentration of said n-type cathode layer is equal to or larger than an acceptor impurity concentration of said p-type cathode layer,
an acceptor impurity concentration of said first p-type anode layer is equal to or larger than a donor impurity concentration of said second p-type anode layer,
an acceptor impurity concentration of said second p-type anode layer is equal to or larger than a donor impurity concentration of said second p-type anode layer, and
a donor impurity concentration of said second p-type anode layer is equal to or larger than a donor impurity concentration of said n-type drift layer.

2. The semiconductor device according to claim 1, wherein
said second p-type anode layer is provided in a position facing said n-type cathode layer, and
a width of said second p-type anode layer is smaller than a width of said n-type cathode layer.

3. The semiconductor device according to claim 2, wherein
a plurality of said second p-type anode layers are provided.

4. The semiconductor device according to claim 1, wherein
said each second p-type anode layer is provided in a position facing each of said n-type cathode layer and said p-type cathode layer, and
a width of said second p-type anode layer provided in a position facing said n-type cathode layer is smaller than a width of said second p-type anode layer provided in a position facing said p-type cathode layer.

5. The semiconductor device according to claim 4, wherein
a plurality of said second p-type anode layers are provided in a position facing said n-type cathode layer.

6. The semiconductor device according to claim 1, wherein
said each second p-type anode layer is provided in a position facing each of said n-type cathode layer and said p-type cathode layer,
a width of said second p-type anode layer provided in a position facing said n-type cathode layer is smaller than a width of said n-type cathode layer, and
a width of said second p-type anode layer provided in a position facing said p-type cathode layer is smaller than a width of said p-type cathode layer.

7. The semiconductor device according to claim 1, wherein
said second p-type anode layer, said n-type cathode layer, and said p-type cathode layer are provided repeatedly.

8. A power conversion device, comprising:
a main conversion circuit having said semiconductor device according to claim 1, and converting and outputting an electrical power being input to said main conversion circuit; and
a control circuit outputting control signals for controlling said main conversion circuit to said main conversion circuit.

* * * * *